(12) United States Patent
Brunco et al.

(10) Patent No.: US 8,828,839 B2
(45) Date of Patent: Sep. 9, 2014

(54) METHODS FOR FABRICATING ELECTRICALLY-ISOLATED FINFET SEMICONDUCTOR DEVICES

(71) Applicant: GLOBALFOUNDRIES, Inc., Grand Cayman (KY)

(72) Inventors: David P. Brunco, Tervuren (BE); Witold Maszara, Morgan Hill, CA (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 39 days.

(21) Appl. No.: 13/753,269

(22) Filed: Jan. 29, 2013

(65) Prior Publication Data

US 2014/0213033 A1  Jul. 31, 2014

(51) Int. Cl.
*H01L 21/00*  (2006.01)
*H01L 21/762*  (2006.01)

(52) U.S. Cl.
CPC ........... *H01L 21/762* (2013.01); *Y10S 438/947* (2013.01); *Y10S 438/942* (2013.01)
USPC ..... 438/400; 438/947; 438/942; 257/E21.023

(58) Field of Classification Search
None
See application file for complete search history.

(56) References Cited

U.S. PATENT DOCUMENTS

| | | | | |
|---|---|---|---|---|
| 7,407,890 B2* | 8/2008 | Yang | | 438/696 |
| 7,781,847 B2* | 8/2010 | Yang | | 257/392 |
| 8,084,310 B2* | 12/2011 | Mebarki et al. | | 438/164 |
| 8,303,831 B2* | 11/2012 | Kim | | 216/41 |
| 8,398,874 B2* | 3/2013 | Kwon et al. | | 216/41 |
| 8,486,840 B2* | 7/2013 | Liaw | | 438/702 |
| 8,524,605 B1* | 9/2013 | Chen | | 438/696 |
| 8,697,580 B2* | 4/2014 | Lee et al. | | 438/700 |
| 2009/0075485 A1* | 3/2009 | Ban et al. | | 438/751 |
| 2009/0087991 A1* | 4/2009 | Yatsuda et al. | | 438/694 |
| 2010/0264468 A1* | 10/2010 | Xu | | 257/288 |
| 2012/0028473 A1* | 2/2012 | Lai et al. | | 438/703 |
| 2012/0040528 A1* | 2/2012 | Kim et al. | | 438/675 |
| 2012/0045901 A1* | 2/2012 | Kim et al. | | 438/703 |
| 2012/0168955 A1* | 7/2012 | Chen et al. | | 257/773 |
| 2012/0205750 A1* | 8/2012 | Sudo | | 257/379 |
| 2013/0023120 A1* | 1/2013 | Yaegashi et al. | | 438/689 |
| 2013/0034963 A1* | 2/2013 | Chung et al. | | 438/700 |
| 2013/0059438 A1* | 3/2013 | Zhou et al. | | 438/689 |
| 2013/0062771 A1* | 3/2013 | Kodama et al. | | 257/773 |
| 2013/0084688 A1* | 4/2013 | O'Meara et al. | | 438/478 |
| 2013/0113085 A1* | 5/2013 | Michaelson et al. | | 257/632 |
| 2013/0157461 A1* | 6/2013 | Kim | | 438/671 |
| 2013/0189845 A1* | 7/2013 | Kim et al. | | 438/696 |

(Continued)

*Primary Examiner* — Charles Garber
*Assistant Examiner* — Evren Seven
(74) *Attorney, Agent, or Firm* — Ingrassia Fisher & Lorenz, P.C.

(57) ABSTRACT

Fabrication methods for semiconductor device structures are provided. In an exemplary embodiment, a method of fabricating an electrically-isolated FinFET semiconductor device includes the steps of forming a silicon oxide layer over a semiconductor substrate including a silicon material and forming a first hard mask layer over the silicon oxide layer. The method further includes the steps of forming a first plurality of void spaces in the first hard mask layer and forming a second hard mask layer in the first plurality of void spaces. Still further, the method includes the steps of removing the remaining portions of the first hard mask layer, thereby forming a second plurality of void spaces in the second hard mask layer, extending the second plurality of void spaces into the silicon oxide layer, and forming a plurality of fin structures in the extended second plurality of void spaces.

20 Claims, 15 Drawing Sheets

(56) References Cited

U.S. PATENT DOCUMENTS

| | | | |
|---|---|---|---|
| 2013/0203253 A1* | 8/2013 | Inoue et al. | 438/689 |
| 2013/0244437 A1* | 9/2013 | Flachowsky et al. | 438/703 |
| 2013/0252425 A1* | 9/2013 | Lin et al. | 438/692 |
| 2013/0260557 A1* | 10/2013 | Wang et al. | 438/669 |
| 2014/0011373 A1* | 1/2014 | Killampalli et al. | 438/795 |

* cited by examiner

METHODS FOR FABRICATING ELECTRICALLY-ISOLATED FINFET SEMICONDUCTOR DEVICES

TECHNICAL FIELD

Embodiments of the subject matter generally relate to semiconductor device fabrication methods. More particularly, the disclosed embodiments relate to methods for fabricating electrically-isolated FinFET semiconductor devices.

BACKGROUND

In contrast to traditional planar metal-oxide-semiconductor field-effect transistors (MOSFETS), which are fabricated using conventional lithographic fabrication methods, nonplanar FETs (Field-Effect Transistors) incorporate various vertical transistor structures, and typically include two or more gate structures formed in parallel. One such semiconductor structure is the "FinFET," which takes its name from the multiple thin silicon "fins" that are used to form the respective gate channels, and which are typically on the order of nanometers in width. Modern FinFET integrated circuits are formed on the surfaces of semiconductor substrates, which are mostly silicon substrates. Individual transistors of the FinFET integrated circuit are electrically isolated from each other by isolation structures formed on the surface of the respective semiconductor substrates. The electrical isolation structures include, for example, shallow trench isolation (STI) regions.

In general, conventional methods of producing an STI feature include first forming a hard mask over the semiconductor substrate, for example, silicon. A trench etching pattern is photolithographically formed over a hard mask dielectric layer, followed by etching through the dielectric hard mask and thereafter etching a trench in the semiconducting substrate surrounding active regions to form an STI feature. Subsequently, the photoresist etching mask is removed and the STI feature is back-filled with a dielectric insulating material. The hard mask layer may also be patterned using a self-aligned double patterning (SADP) scheme.

Conventionally, STI regions are etched with a sequential process flow, where the hard mask layers are etched, followed by etching of the silicon trench. Etching is frequently performed by a plasma enhanced etching process, for example reactive ion etching (RIE). Typically, in a plasma etching process an etchant source gas supplied to an etching chamber where the plasma is ignited to generate ions from the etchant source gas. Ions are then accelerated towards the process wafer substrate, frequently by a voltage bias, where they remove silicon material (etch) from the process wafer. Various gas chemistries are used to provide variable etching rates for different etching target materials. Frequently used etchant sources include chlorine and bromine based etchants, for example $Cl_2$ and HBr. As device sizes continue to decrease, however, it becomes more difficult to control the rate at which the silicon material is etched from the process wafer. As such, an undesirable variability may be introduced into the process with trenches of varying depths produced due to uneven etching.

Further, STI regions are conventionally back-filled using one of the two methods: high-density plasma chemical vapor deposition (HDP) and high aspect-ratio process (HARP) for the gap-filling. The HDP may be used to fill gaps with aspect ratios less than about 6.0 without causing voids. The HARP may be used to fill gaps with aspect ratios less than about 7.0 without causing voids. As device sizes continue to decrease, however, the gap fill of STI openings becomes problematic, and the process window for successful gap filling is narrowed. For example, voids may be formed because deposition at the opening of the STI trenches reduces deposition towards the bottom of the trenches. Such voids may cause faulty devices and contribute to yield loss.

Accordingly, it is desirable to provide semiconductor devices and related fabrication methods that provide electrical isolation but without the need to etch trenches into the silicon process wafer. In addition, it is desirable to provide semiconductor devices and related fabrication methods that provide electrical isolation but without the need to gap-fill the etched trenches. Furthermore, other desirable features and characteristic of the present disclosure will become apparent from the subsequent detailed description and the appended claims, taken in conjunction with the accompanying drawings and this background of the disclosure.

BRIEF SUMMARY

The disclosed embodiments relate to methods for fabricating semiconductor devices. In one exemplary embodiment, a method of fabricating an electrically-isolated FinFET semiconductor device includes the steps of forming a silicon oxide layer over a semiconductor substrate including a silicon material, forming a first hard mask layer over the silicon oxide layer, forming a plurality of sacrificial mandrels over the first hard mask layer, and forming a plurality of sidewall spacers along the sides of the plurality of sacrificial mandrels. The method further includes the steps of removing each of the plurality of sacrificial mandrels and portions of the first hard mask layer below the sacrificial mandrels, thereby forming a first plurality of void spaces between the sidewall spacers and remaining portions of the first hard mask layer, and forming a second hard mask layer in the first plurality of void spaces. Still further, the method includes the steps of removing the sidewall spacers and the remaining portions of the first hard mask layer, thereby forming a second plurality of void spaces in the second hard mask layer, extending the second plurality of void spaces into the silicon oxide layer, and forming a plurality of fin structures in the extended second plurality of void spaces. Each fin structure of the plurality of fin structures is electrically isolated by remaining portions of the silicon oxide layer.

In accordance with another exemplary embodiment, a method of fabricating an electrically-isolated FinFET semiconductor device includes the steps of forming a silicon oxide layer over a semiconductor substrate including a silicon material, forming a plurality of sacrificial mandrels over the first hard mask layer, and forming a plurality of sidewall spacers along the sides of the plurality of sacrificial mandrels. The method further includes the steps of removing each of the plurality of sacrificial mandrels, thereby forming a first plurality of void spaces between the sidewall spacers, and forming an interlayer dielectric layer in the first plurality of void spaces. Still further, the method includes removing the sidewall spacers, thereby forming a second plurality of void spaces in the interlayer dielectric layer, extending the second plurality of void spaces into the silicon oxide layer, and forming a plurality of fin structures in the extended second plurality of void spaces. Each fin structure of the plurality of fin structures is electrically isolated by remaining portions of the interlayer dielectric layer and the silicon oxide layer.

In yet another exemplary embodiment, a method of fabricating an electrically-isolated FinFET semiconductor device includes the steps of forming a thermal oxide layer over a semiconductor substrate including a silicon material by exposing the semiconductor substrate including the silicon material to an elevated temperature in the presence of an oxide-forming material, depositing a silicon nitride layer over the thermal oxide layer, depositing and etching an amorphous silicon material to form a plurality of sacrificial mandrels over the silicon nitride layer, and depositing and etching a silicon oxide material to form a plurality of sidewall spacers along the sides of the plurality of sacrificial mandrels. The method further includes the steps of removing each of the plurality of sacrificial mandrels by applying an etchant selective to amorphous silicon and removing portions of the silicon nitride layer below the sacrificial mandrels by applying an etchant selective to silicon nitride, thereby forming a first plurality of void spaces between the sidewall spacers and remaining portions of the silicon nitride layer, and depositing an amorphous carbon material in the first plurality of void spaces. Still further, the method includes the steps of removing the sidewall spacers by applying an etchant selecting to silicon oxide and removing the remaining portions of the silicon nitride layer by applying an etchant selective to silicon nitride, thereby forming a second plurality of void spaces in the amorphous carbon material, extending the second plurality of void spaces into the silicon oxide layer by applying an etchant selective to silicon oxide, and epitaxially growing Si, Si:C, SiGe, Ge, and/or group III-V compounds in the extended second plurality of void spaces to form a plurality of fin structures. Each fin structure of the plurality of fin structures is electrically isolated by remaining portions of the silicon oxide layer.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

FIGS. 1-9 illustrate a CMOS device structure 100, in particular a FinFET CMOS device structure, and related process steps for fabricating the CMOS device structure 100 employing electrical isolation between the individual semiconductive transistor structures disposed thereon. Although the subject matter is described herein in the context of a CMOS semiconductor device, the subject matter is not intended to be limited to CMOS semiconductor devices, and may be utilized with other semiconductor devices which are not CMOS semiconductor devices. Additionally, although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. Various steps in the fabrication of MOS semiconductor devices are well known and so, in the interest of brevity, many conventional steps will only be mentioned briefly herein or will be omitted entirely without providing the well-known process details.

Figure 1:
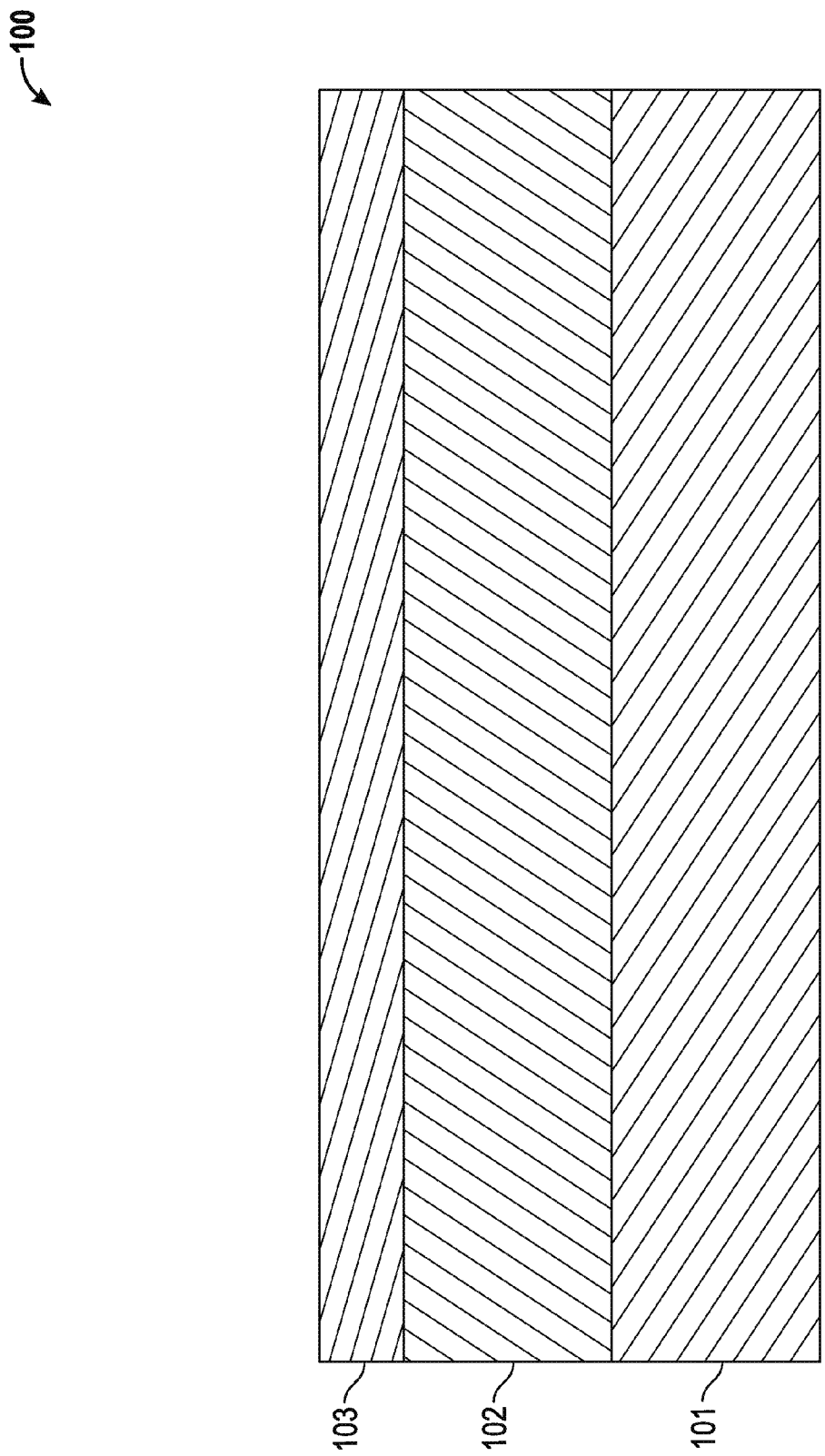
FIGS. 1-9 are cross-sectional views that illustrate a complementary metal oxide semiconductor (CMOS) device structure and methods for fabricating the CMOS device structure in an exemplary embodiment.

Referring to FIG. 1, in accordance with an exemplary embodiment of the present disclosure, a method for fabricating a FinFET CMOS device structure 100 includes the step of providing a semiconductor substrate 101. As used herein, the term "semiconductor substrate" will be used to encompass semiconductor materials conventionally used in the semiconductor industry from which to make electrical devices. "Semiconductor materials" include monocrystalline silicon materials, such as the relatively pure or impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide and other III-V compounds, zinc oxide, glass, and the like. Furthermore, "semiconductor substrate" also includes semiconductor on insulator substrates, such as silicon-on-insulator (SOI) and its variants.

The semiconductor substrate 101 may have formed thereof any other material layers overlying the semiconductor substrate 101, such as insulator layers, mask layers, and the like. For example, in one exemplary embodiment, as shown in FIG. 1, a silicon oxide layer 102, which may be a thermally-formed oxide layer, is provided overlying the semiconductor substrate 101. Thermal oxidation is typically performed in a furnace or a rapid thermal processor at an elevated temperature (for example from about 700° C. to about 1100° C.) in the presence of an oxide forming material, such as an oxidizing ambient. Thermal oxidation can be classified into wet and dry thermal oxidation depending on the oxidizing ambient. During thermal oxidation, a silicon substrate is consumed (0.44 nm with respect to every 1 nm of growing thermal oxide layer) and a volume expansion occurs (2.2 times the consumed silicon). This silicon oxide layer should be from 20 to 200 nm thick, and preferably between 50 and 150 nm thick. In an exemplary embodiment, the semiconductor substrate is exposed to a wet oxidation ambient for about 30 minutes at about 900° C. to form an oxide layer 102 that is about 70 nm thick. In alternative embodiments, the oxide layer 102 may be formed using conventional chemical vapor deposition (CVD) of a silicon oxide material.

A first hard mask layer 103, such as a silicon nitride layer, may be deposited overlying silicon oxide layer 102. The hard mask layer includes any mask material that exhibits a lower etch rate than the silicon oxide layer 102 when subjected to the same etch chemistry. The hard mask layer can be, for example, a layer of silicon nitride (e.g., $Si_3N_4$, $SiN_x$). The silicon nitride layer may be formed by, for example, chemical vapor deposition. The silicon nitride layer, in an embodiment, has a thickness of from about 10 nm to about 70 nm, for example about 50 nm.

Figure 2:
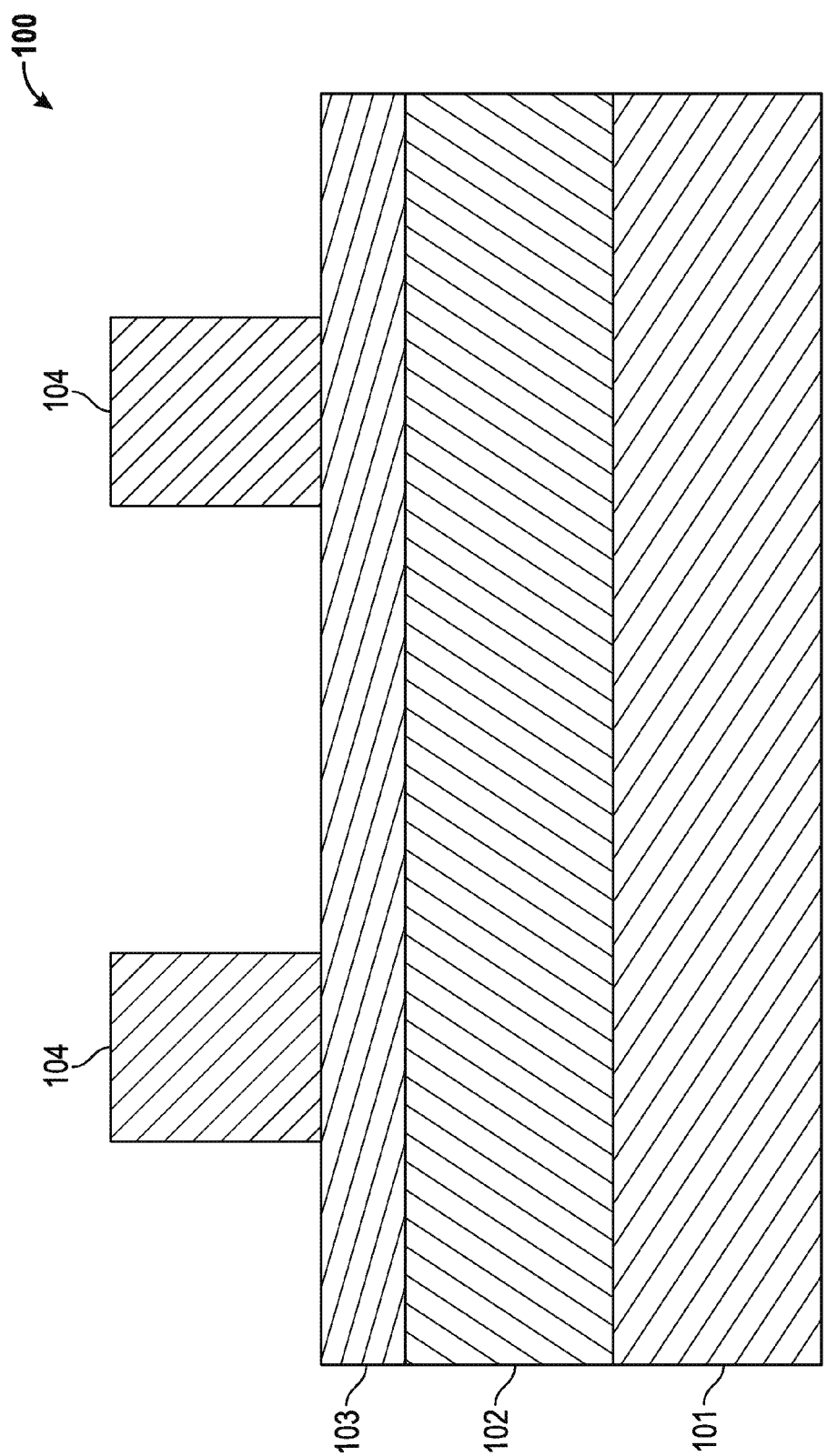

Referring now to FIG. 2, a mandrel-forming layer is deposited over hard mask layer 103 utilizing a known deposition technique, such as chemical vapor deposition. The mandrel-forming layer can include various types of materials including, for example, polycrystalline silicon, silicon oxynitride, amorphous silicon, silicon oxide, silicon nitride, and the like. As illustrated in FIG. 2, selected portions of the mandrel-forming layer are next removed to create a number of sacrificial mandrels 104 along the upper surface of hard mask layer 103. The selected portions of the mandrel-forming layer can be removed by first depositing photoresist over the mandrel-forming layer, patterning the photoresist, etching the portions of the mandrel-forming layer exposed through patterned photoresist, and subsequently removing the patterned photoresist. If desired, a plasma etching process can be utilized to remove the portions of the mandrel-forming layer exposed through the patterned photoresist or other mask. More specifically, a reactive ion etch process can be performed utilizing a chemistry selective to the mandrel-forming layer. In an embodiment, the mandrel-forming layer can be deposited to a thickness of, for example, about 100 nm.

Figure 3:
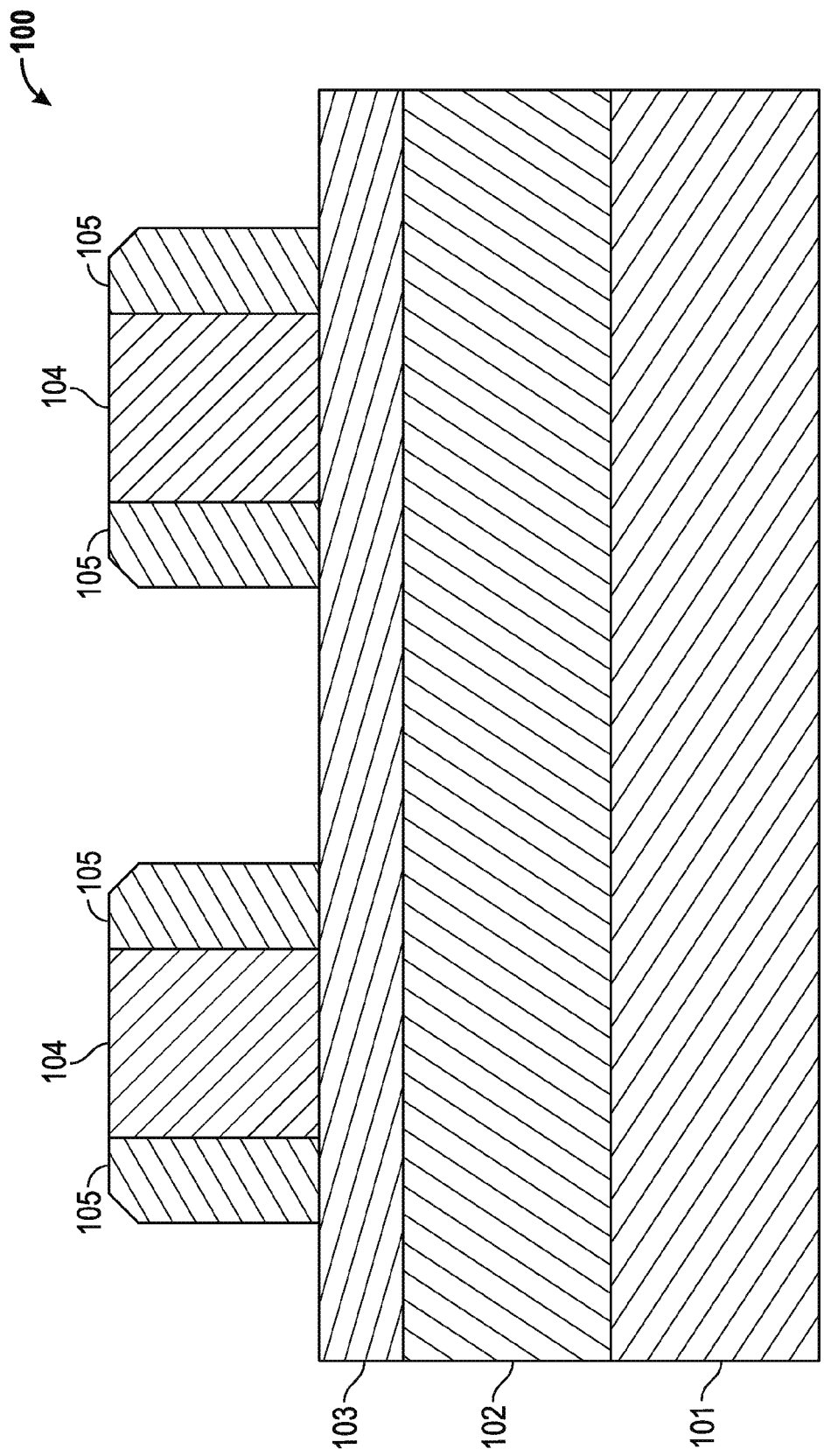

Referring now to FIG. 3, after etching the mandrel-forming layer to yield sacrificial mandrels 104 in the above-described manner, a spacer-forming layer is deposited over sacrificial mandrels 104 and hard mask layer 103 to form sidewall spacers 105 about sacrificial mandrels 104. The spacer-forming layer is formed via the blanket deposition of silicon nitride, silicon oxide, or another suitable dielectric material. In a preferred group of embodiments, the composition of the spacer-forming layer is chosen to permit sacrificial mandrels 104 to be removed via a subsequent etching process that selectively etches the mandrel-forming layer over the spacer-forming layer; e.g., the mandrel-forming layer and the spacer-forming layer may be formed of an amorphous silicon material and a silicon oxide material, respectively, thereby permitting sacrificial mandrels 104 formed from the mandrel-forming layer to be selectively removed utilizing a suitable wet and/or dry etch, such as a tetramethylammonium hydroxide (TMAH) wet etch and/or a reactive ion dry etch. The thickness to which the spacer-forming layer is deposited will generally depend upon the desired critical dimensions of the final CMOS structure; however, as a non-limiting example, the spacer-forming layer is deposited to a thickness of about 10 nm to about 40 nm. The spacer-forming layer is next subjected to a series of etching steps to form sidewall spacers 105 about sacrificial mandrels 104. An anisotropic or directional etch is performed to remove selected portions of the spacer-forming layer to thereby create sidewall spacers 105 adjacent opposing sides of each sacrificial mandrel 104.

Figure 4:
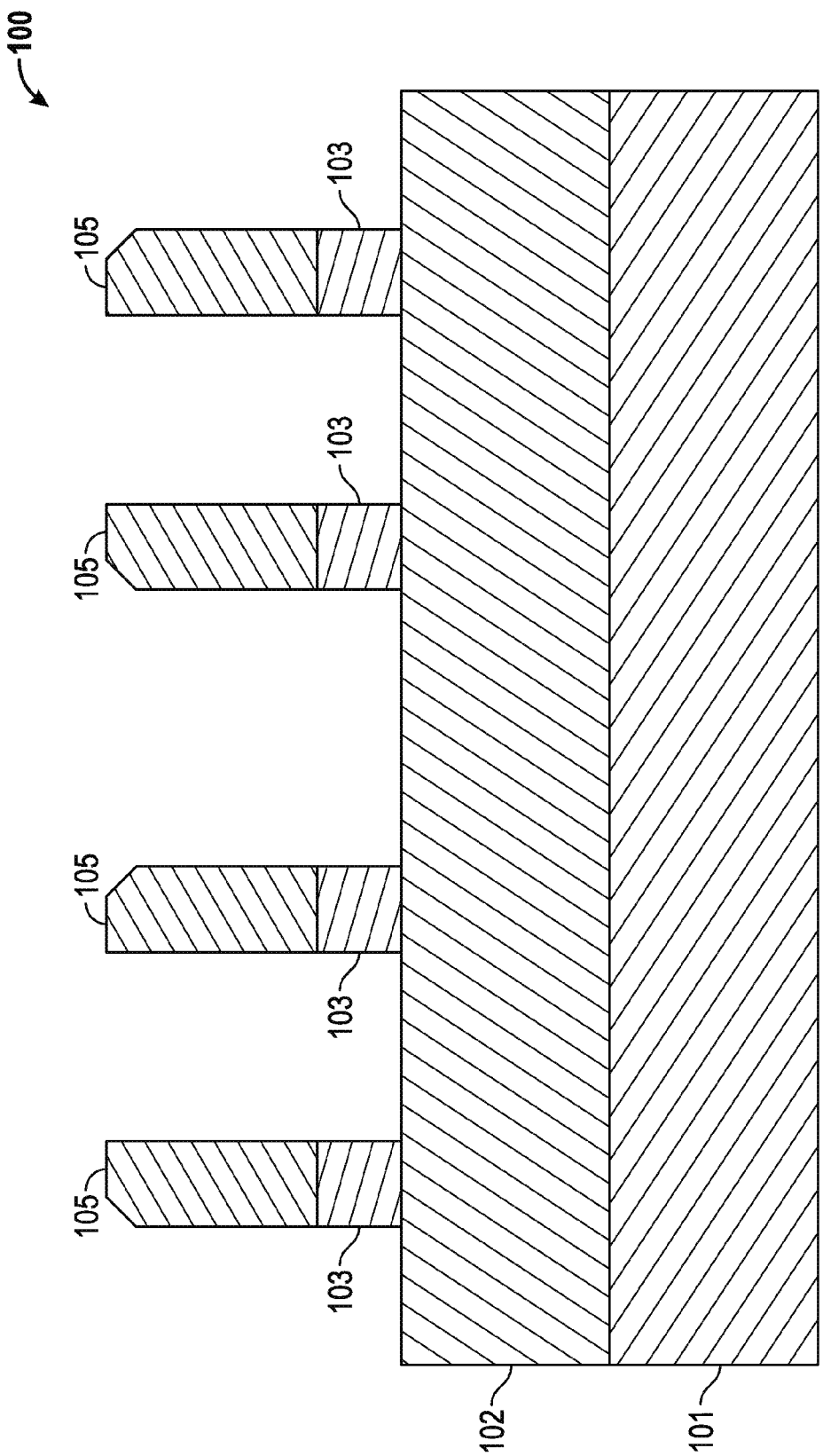

Next, as indicated in FIG. 4, a second etching process is performed to selectively remove sacrificial mandrels 104 while leaving intact the bulk of sidewall spacers 105. For example, as previously stated, sacrificial mandrels 104 can be selectively removed utilizing a TMAH wet etch and/or a dry etch in embodiments wherein sacrificial mandrels 104 are formed from a layer of amorphous silicon and sidewall spacers 105 are formed from a layer of silicon oxide. After removal of sacrificial mandrels 104, one or more additional etching steps are performed to remove the portions of hard mask (for example, silicon nitride) layer 103 that is not located beneath sidewall spacers 105, thereby forming a plurality of void spaces between the sidewall spacers 105 and the remaining portions of hard mask layer 103.

Figure 5:
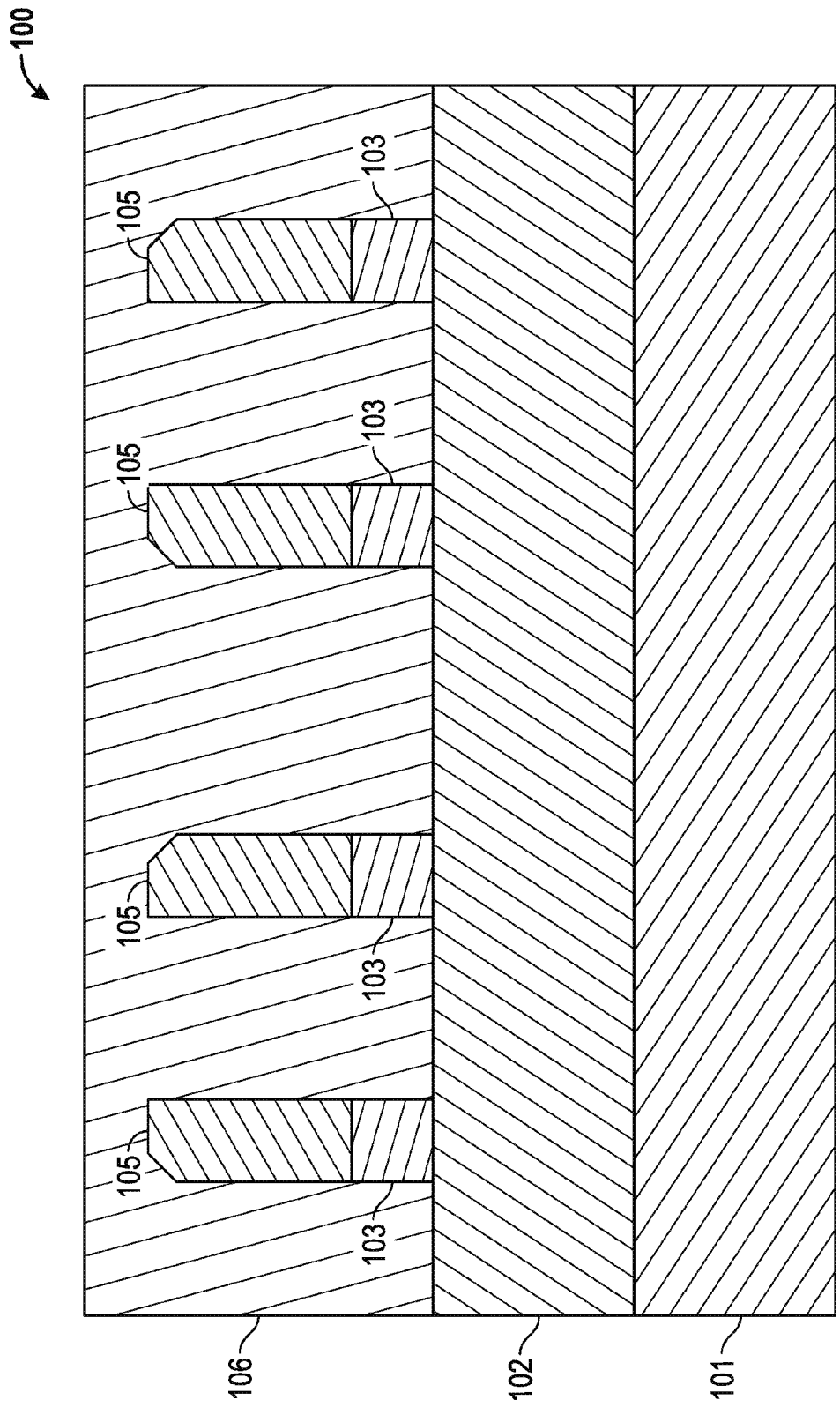

Referring to FIG. 5, a second hard mask layer 106 is formed overlying substrate sidewall spacers 105 and oxide layer 102. Hard mask layer 106 may include a deposited silicon oxide, silicon nitride, silicon oxynitride, polycrystalline silicon, amorphous silicon, amorphous carbon (a-C), carbon-doped silica (SiCOH), or another material suitable for providing sufficient gap filling between sidewall spacers 105. Hard mask layer 106 may be blanket-deposited using, for example, a PECVD, a low pressure chemical vapor deposition (LPCVD), a CVD process, or an atomic layer deposition (ALD) process. In one embodiment, hard mask layer 106 includes an amorphous carbon material and has a thickness of about 20 nm to about 1 micron, for example a thickness of about 50 nm to about 500 nm.

Figure 6:
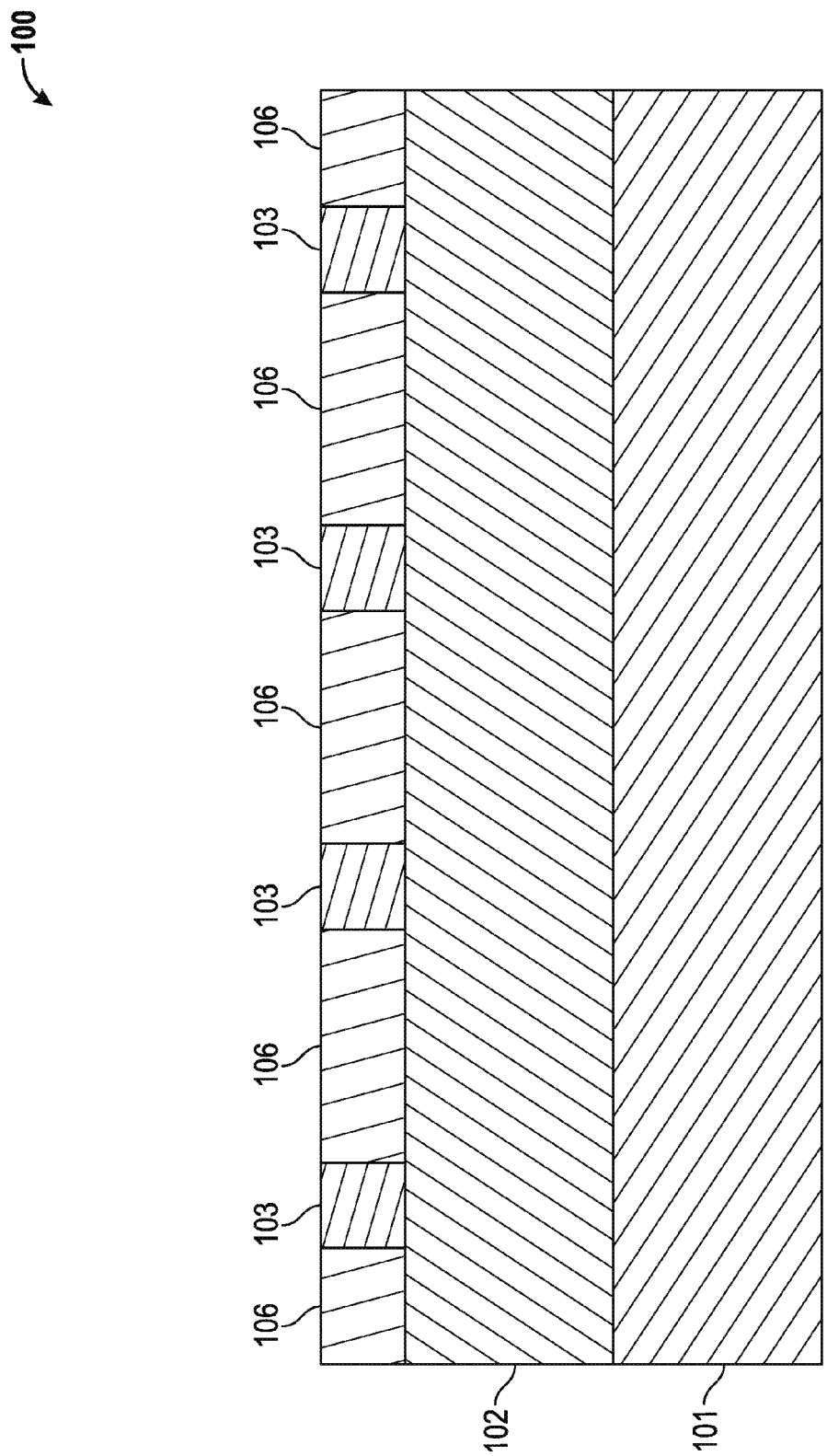

As shown in FIG. 6, the sidewall spacers 105 in addition to a portion of the second hard mask layer 106 are removed using a suitable etching or planarization technique, thereby leaving void spaces in the second hard mask layer 106. The remaining portions of first hard mask layer 103 function as an etch-stop for the etching or planarization step. In one example, the semiconductor device 100 is planarized using chemical mechanical planarization (CMP), wherein the second hard mask layer 106 is exposed to an abrasive and corrosive chemical slurry (commonly a colloid) in conjunction with a polishing pad. After planarization, the second hard mask 106 remains as a discontinuous layer disposed between the remaining portions of first hard mask layer 103. The hard mask layers 103 and 106 remain having a thickness approximately equivalent to or somewhat less than the first hard mask layer 103.

Figure 7:
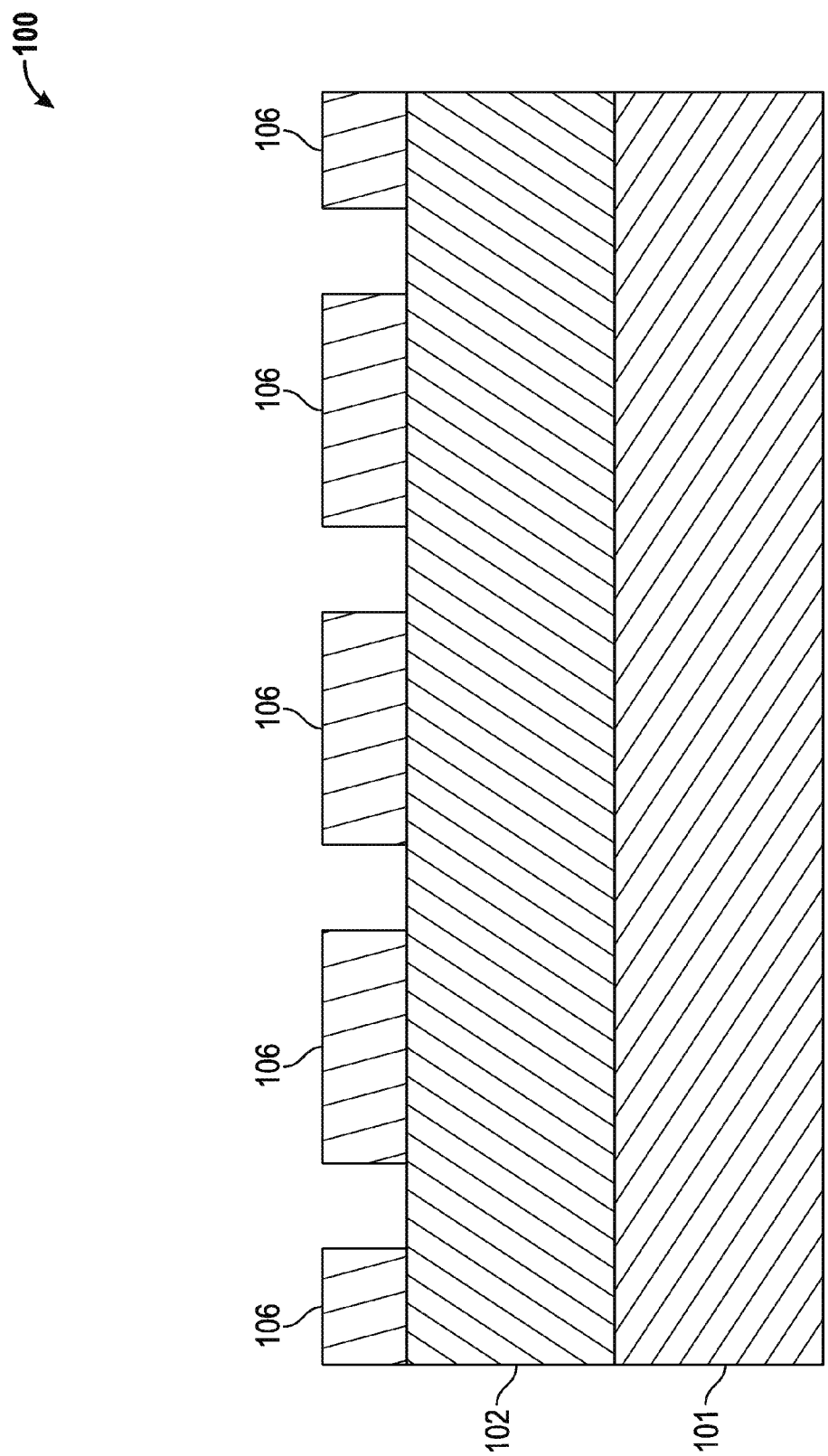

Next, as indicated in FIG. 7, a subsequent etching process is performed to selectively remove the remaining portions of first hard mask layer 103, while leaving intact the bulk of the remaining portions of second hard mask layer 106. For example, the remaining portions of first hard mask layer 103 can be selectively removed utilizing a hot phosphoric acid wet etch in embodiments wherein such layer was formed from a layer of silicon nitride and the second hard mask layer 106 was formed from a layer of amorphous carbon. This etching step results in the formation of a discontinuous second hard mask layer 106 overlying silicon oxide layer 102. The remaining open spaces in the second hard mask layer 106 have a width that is approximately equivalent to the removed portions of first hard mask layer 103. This process described for FIGS. 5, 6, and 7 essentially serves to reverse the tone of the hard mask such that the regions originally covered by the first hard mask 103 are now exposed and the regions originally uncovered are now covered by the second hard mask 106.

Figure 8:
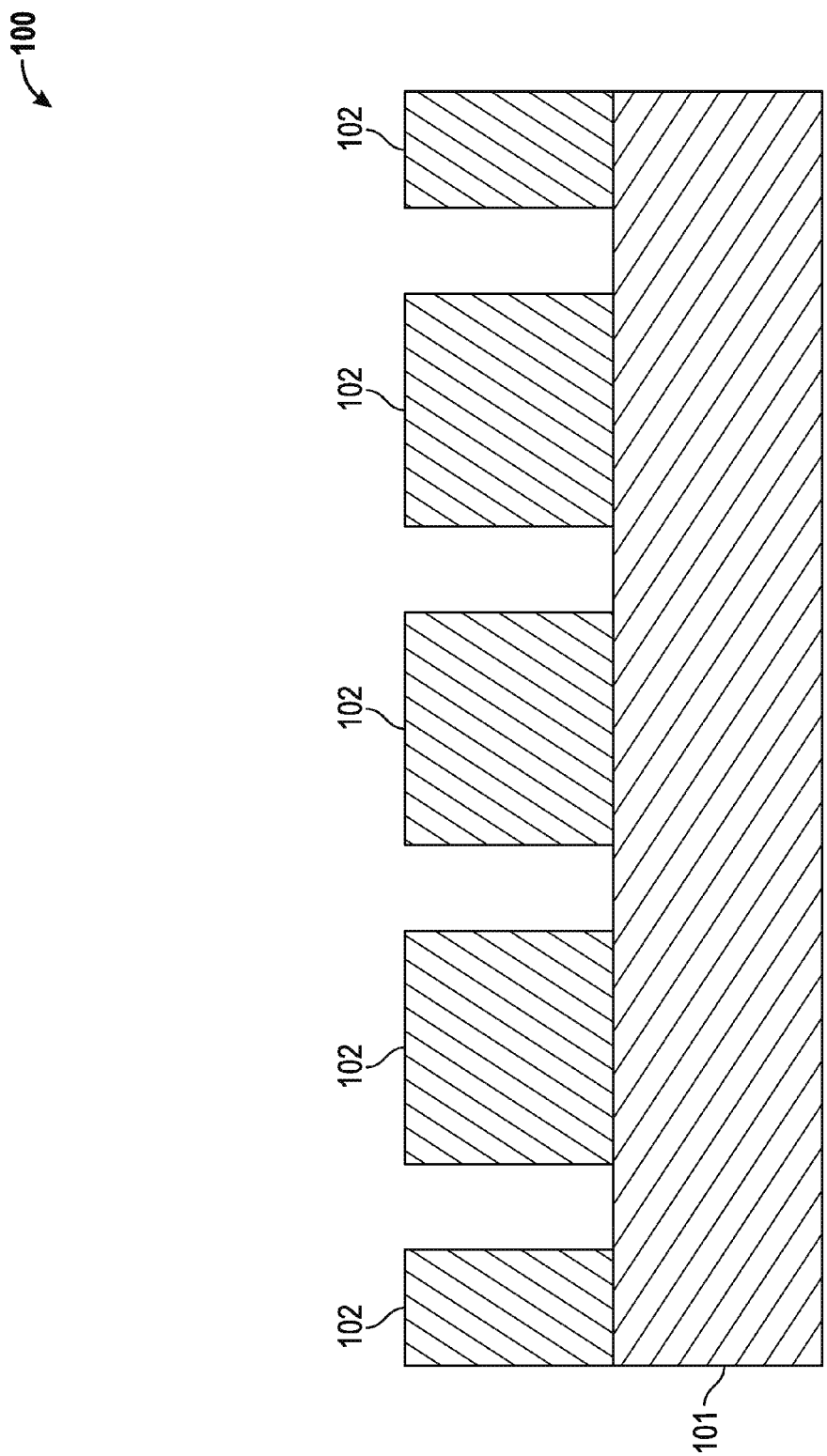

Referring now to FIG. 8, the fabrication process continues by removing a portion of the silicon oxide layer 102 and the remaining hard mask layer 106, while leaving a second portion of the oxide layer 102 intact, thereby extending the previously formed void spaces. Selective removal of the oxide layer 102 in this manner reveals an accessible (exposed) surface of the semiconductor silicon material 101. In practice, the oxide material from layer 102 is removed by selectively etching the desired sections of the oxide layer 102, using the remaining portions of layer 106 as a hard mask, and without etching the underlying semiconductor material in layer 101. The remaining portions of hard mask layer 106 serve as an etch mask that overlies and protects some sections of oxide material layer 102 overlying the semiconductor material layer 101, while leaving other sections of the oxide material layer 102 overlying the semiconductor material layer 101 exposed. Thus, the etch mask will protect the covered sections of oxide material layer 102 overlying the semiconductor material layer 101 during this selective etching step. The etching technique and etch chemistry used to remove the oxide material layer 102 do not permanently damage or otherwise create surface defects in the underlying semiconductor material 101. Thus, the oxide material layer 102 is preferably etched in a manner that is highly selective to the oxide material. For this exemplary embodiment, an anisotropic dry etch is used to remove the oxide material layer 102. Subsequently, the remaining portions of second hard mask layer 106, which as noted above in an exemplary embodiment includes amorphous carbon, are removed by an "ashing" process known in the art, wherein the semiconductor device is exposed to an elevated temperature (for example greater than about 200° C.) to oxidize the amorphous carbon into gaseous oxides of carbon (for example $CO_2$), which dissociate from the device 100.

Figure 9:
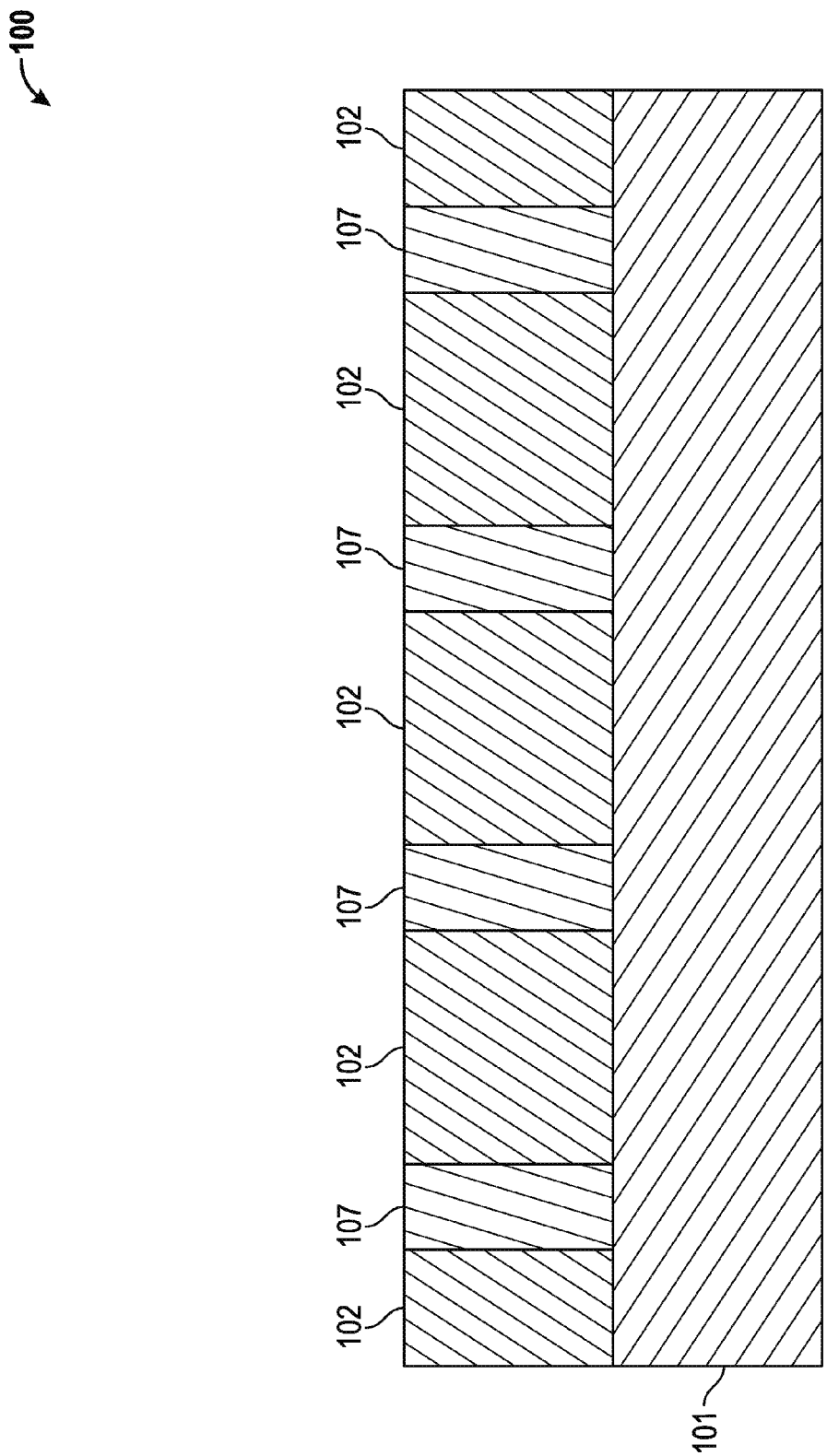

Referring now to FIG. 9, the removed portions of silicon oxide layer 102 are filled by a process of selective epitaxial growth of a monocrystalline material to form fins 107. These fins 107 are used to form the respective gate channels in the FinFET CMOS device structure 100, as is well-known in the art. For a PMOS transistor, the selective epitaxial material is preferably silicon germanium (SiGe) or Ge or a stack thereof. Selective epitaxial growth is a process by which monocrystalline material is selectively grown in the removed portions of oxide layer 102 using the monocrystalline silicon material from layer 101 at the bottom of the removed portions as a nucleating site for the monocrystalline growth. Germanium is a larger atom than silicon, and the addition of germanium to the silicon creates a crystalline material having a larger lattice constant than the lattice constant of the host silicon layer. Epitaxial growth of such Ge containing layer in a narrow fin on a silicon substrate essentially results in uniaxial compressive stress in the longitudinal direction (direction of electrical current flow) in the epitaxial layer, which significantly increases the mobility of majority carrier holes in the channel for a PMOS transistor. The channel portion of the epitaxial layer preferably contains about 25% to about 100% germanium.

NMOS transistors can be fabricated in a similar manner. For an NMOS transistor, the removed portions of oxide layer 102 are filled by selective epitaxial growth of a monocrystalline material such as silicon carbon alloy (Si:C) having a smaller lattice constant than the lattice constant of silicon. Carbon is a smaller atom than silicon and the addition of carbon to silicon creates a crystalline material having a smaller lattice constant than that of silicon. Filling the removed portions of oxide layer 102 with a monocrystalline material such as Si:C results in an uniaxial tensile stress being applied. A tensile longitudinal stress increases the mobility of majority carrier electrons in the channel of an NMOS transistor. The Si:C can include up to about 10% carbon and preferably includes about 0% to about 3% carbon, for example about 1% to about 2%. High electron mobility material comprising Ge, GaAs, InAs, InSb, InP, InGaAs, InAlAs and other III-V compounds may also be used.

For either a PMOS transistor or an NMOS transistor, impurity doping elements can be added to the epitaxial growth reactants to appropriately dope the well and channel regions to be formed in subsequent fabrication steps. For example, phosphorus or arsenic can be added to the reactants during the epitaxial growth of SiGe and/or Ge and boron can be added to the reactants during the epitaxial growth of Si:C. Alternatively (or additionally), the device structure can subsequently be impurity doped by ion implantation.

The structure illustrated in FIG. 9 provides a plurality of semiconductor fin structures 107 that are electrically isolated from one another by the remaining portions of silicon oxide layer 102 disposed in between the fin structures 107. As such, the exemplary embodiment heretofore described provides a method for fabricating an electrically isolated CMOS FinFET device that does not include any shallow trench isolation (STI) structures, and thereby avoids the fabrication problems associated with the etching and deposition of STI structures described above in the background of this disclosure. At this point, conventional FinFET processing may continue with exposure of the fins, gate formation (gate first or dummy gate), junction engineering, contacts, metallization, etc.

Figure 10:
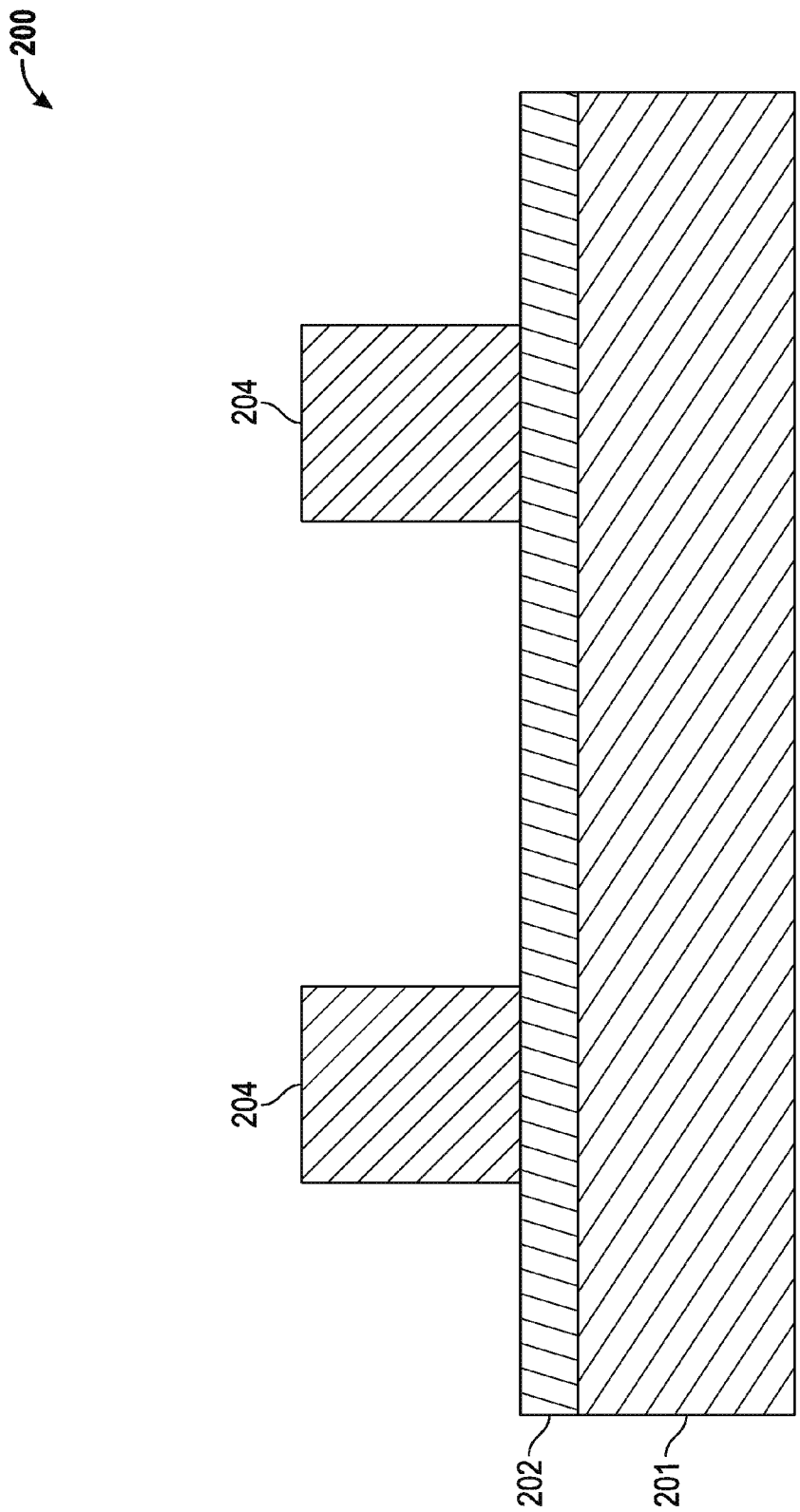
FIGS. 10-15 are cross-sectional views that illustrate a CMOS device structure and methods for fabricating the CMOS device structure in another exemplary embodiment.

Referring to FIG. 10, in accordance with another exemplary embodiment of the present disclosure, a method for fabricating a FinFET CMOS device structure 200 includes the step of providing a semiconductor substrate 201. The semiconductor material is preferably a silicon substrate. The silicon substrate may be a bulk silicon wafer or may include a silicon-containing material disposed on a silicon oxide material, commonly known as a silicon-on-insulator (SOI) structure that, in turn, is supported by a support substrate.

The semiconductor substrate 201 may have formed thereof any other material layers overlying the semiconductor substrate 201, such as insulator layers, mask layers, and the like. For example, in one exemplary embodiment, as shown in FIG. 10, a silicon oxide etch stop layer 202, which may be a thermally-formed oxide layer, is provided overlying the semiconductor substrate 201. In an exemplary embodiment, the oxide etch stop layer 202 that is at most about 5 nm to about 20 nm thick, for example about 10 nm thick. The oxide etch stop layer 202 is provided as an etch stop for a subsequent etching step, described in greater detail below. It also serves as the bottom layer of the device isolation. In alternatively embodiments, oxide etch stop layer 202 may be formed using conventional chemical vapor deposition (CVD) of a silicon oxide material.

As further shown in FIG. 10, a mandrel-forming layer is deposited over silicon oxide etch stop layer 202 utilizing a known deposition technique, such as chemical vapor deposition. The mandrel-forming layer can include various types of materials including, for example, polycrystalline silicon, silicon oxynitride, amorphous silicon, silicon oxide, silicon nitride, and the like. As illustrated in FIG. 10, selected portions of the mandrel-forming layer are next removed to create a number of sacrificial mandrels 204 along the upper surface of oxide etch stop layer 202. The selected portions of the mandrel-forming layer can be removed by first depositing photoresist over the mandrel-forming layer, patterning the photoresist, etching the portions of the mandrel-forming layer exposed through patterned photoresist, and subsequently removing the patterned photoresist. If desired, a plasma etching process can be utilized to remove the portions of the mandrel-forming layer exposed through the patterned photoresist or other mask. More specifically, a reactive ion etch process can be performed utilizing a chemistry selective to the mandrel-forming layer. In an embodiment, the mandrel-forming layer can be deposited to a thickness of, for example, about 100 nm.

Figure 11:
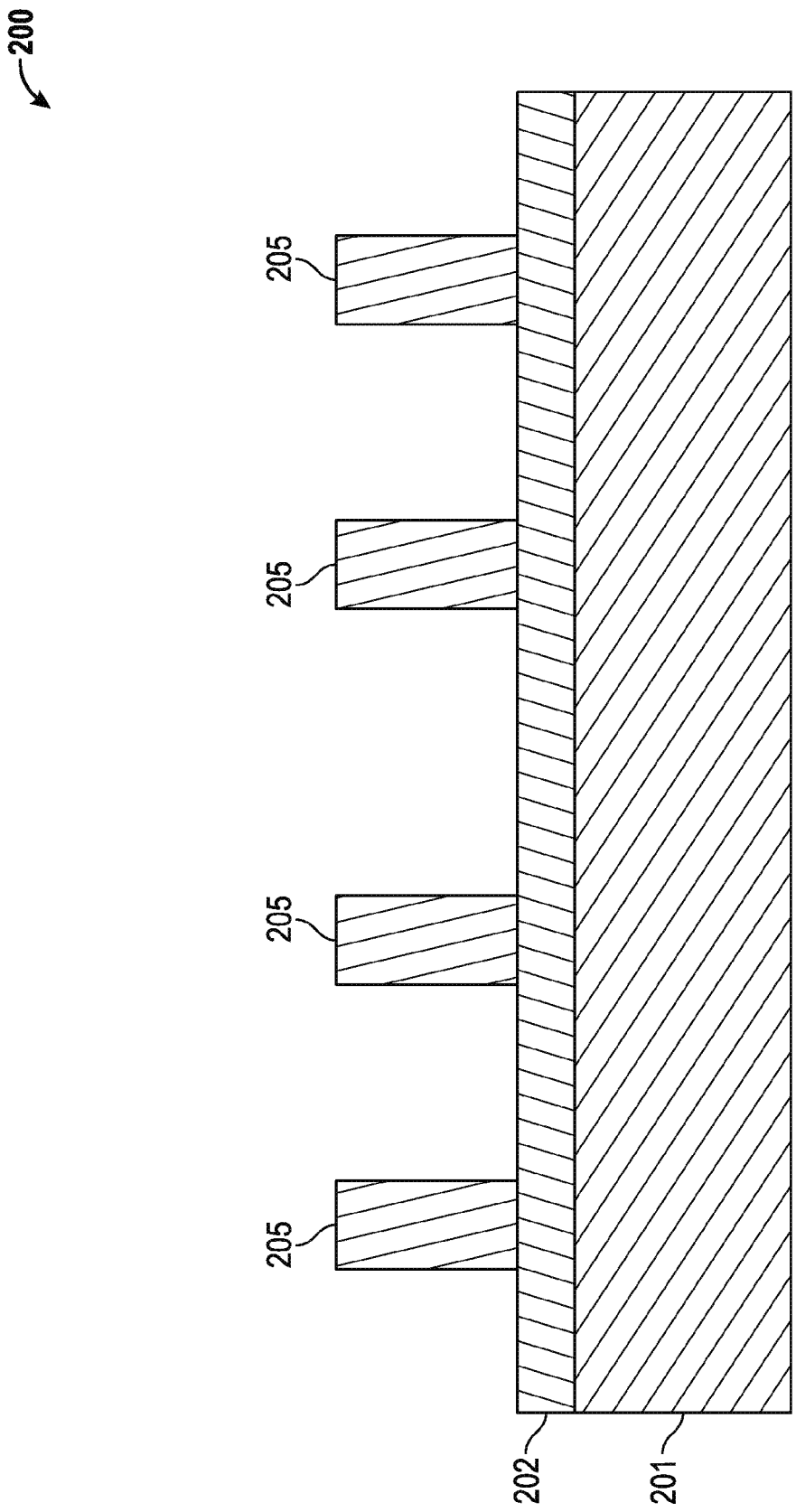

Referring now to FIG. 11, after etching the mandrel-forming layer to yield sacrificial mandrels 204 in the above-described manner, a spacer-forming layer is deposited over sacrificial mandrels 204 and oxide etch stop layer 202 to form sidewall spacers 205 about sacrificial mandrels 204. The spacer-forming layer is formed via the blanket deposition of silicon nitride, silicon oxide, or another suitable material. In a preferred group of embodiments, the composition of the spacer-forming layer is chosen to permit sacrificial mandrels 204 to be removed via a subsequent etching process that is selective to the mandrel-forming layer over the spacer-forming layer; e.g., the mandrel-forming layer and the spacer-forming layer may be formed of an amorphous silicon material and a silicon nitride material, respectively, thereby permitting sacrificial mandrels 204 formed from the mandrel-forming layer to be selectively removed utilizing a suitable wet or dry etch, such as TMAH wet etch and/or a reactive ion dry etch. The thickness to which the spacer-forming layer is deposited will generally depend upon the desired critical dimensions of the final CMOS structure; however, as a non-limiting example, the spacer-forming layer is deposited to a thickness of about 15 nm to about 40 nm. The spacer-forming layer is next subjected to a series of etching steps to form sidewall spacers 205 about sacrificial mandrels 204. An anisotropic or directional etch is performed to remove selected portions of the spacer-forming layer to thereby create sidewall spacers 205 adjacent opposing sides of each sacrificial mandrel 204. The oxide etch stop layer 202 serves as an etch stop to protect the semiconductor substrate 201 during the spacer etch.

Next, as indicated in FIG. 11, a second etching process is performed to selectively remove sacrificial mandrels 204 while leaving intact the bulk of sidewall spacers 205, forming a plurality of void spaces between the sidewall spacers 205. For example, as previously stated, sacrificial mandrels 204 can be selectively removed utilizing a TMAH wet etch and/or a dry etch in embodiments wherein sacrificial mandrels 204 are formed from a layer of amorphous silicon and sidewall spacers 205 are formed from a layer of silicon nitride. The oxide etch stop layer 202 additionally serves as an etch stop to protect the semiconductor substrate 201 during the etch to remove the sacrificial mandrels.

Figure 12:
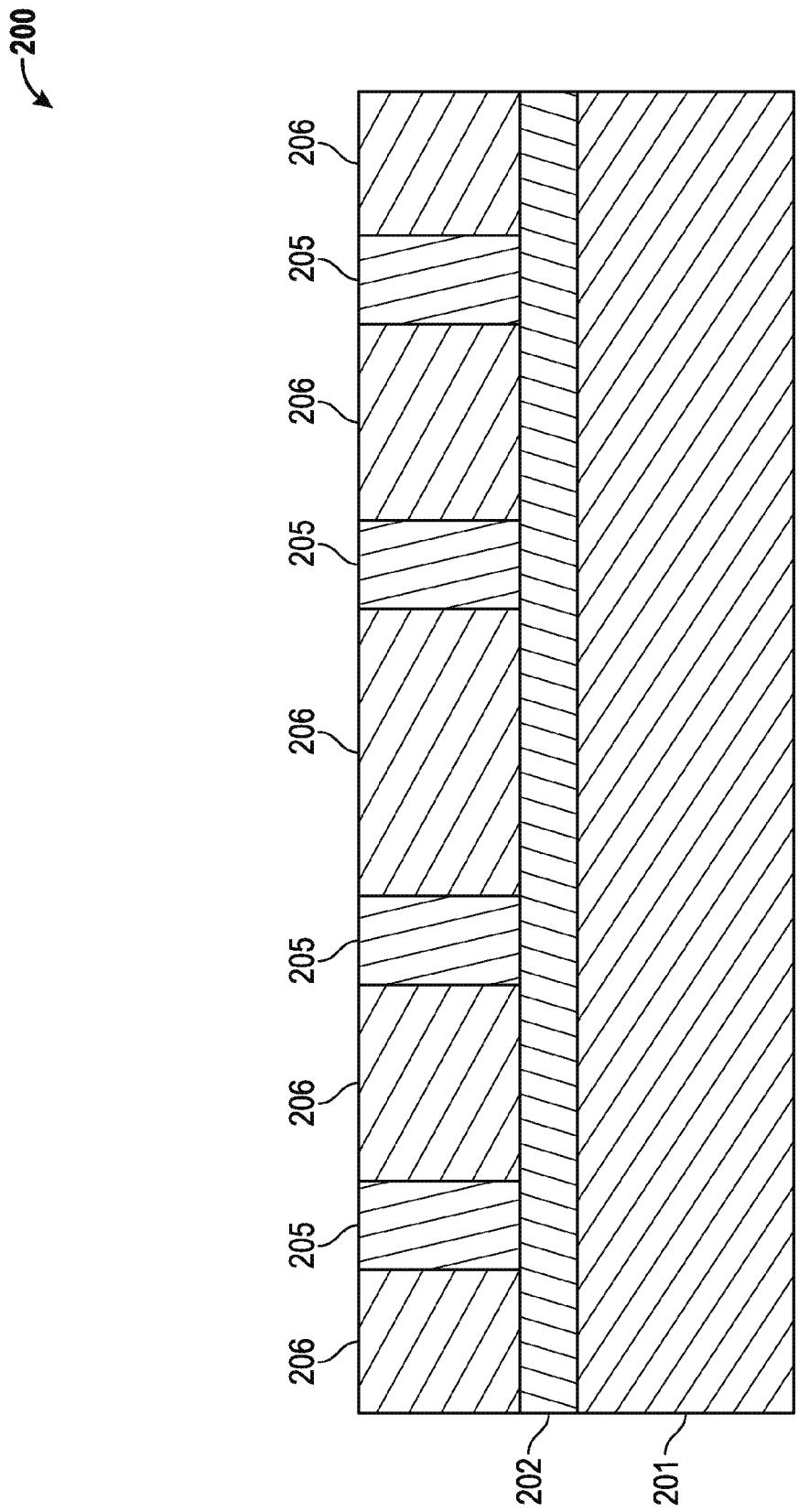

Referring to FIG. 12, an inter-layer dielectric (ILD) comprising primarily silicon oxide layer 206 is formed overlying substrate sidewall spacers 205 and oxide etch stop layer 202. ILD layer 206 may include a deposited silicon oxide, silicon nitride, or silicon oxynitride, or another material suitable for providing electrical isolation between semiconductive transistor structures. ILD layer 206 may be blanket-deposited using, for example, a PECVD, a low pressure chemical vapor deposition (LPCVD), or a CVD process. In one embodiment, ILD layer 206 includes a silicon oxide material and has a thickness of about 20 nm to about 1 micron, for example a thickness of about 50 nm to about 500 nm.

As further shown in FIG. 12, a portion of the ILD layer 206 and a small portion of the sidewall spacers 205 are removed using a suitable etching or planarization technique. The sidewall spacers 205 function as an etch-stop for the etching or planarization step. In one example, the semiconductor device 200 is planarized using chemical mechanical planarization (CMP), wherein the sidewall spacers 205 and the ILD layer 206 are exposed to an abrasive and corrosive chemical slurry (commonly a colloid) in conjunction with a polishing pad. After planarization, the ILD layer 206 remains as a discontinuous layer disposed between the remaining portions of sidewall spacers 205. In an embodiment where the mandrel-forming layer was deposited to a thickness of about 100 nm, it is expected that about 10 nm of the sidewall spacers 205 will be removed due to the CMP step with the sidewall spacers 205 functioning as the etch stop, leaving a thickness of both the remaining portions of ILD layer 205 and sidewall spacers 205 of about 90 nm.

Figure 13:
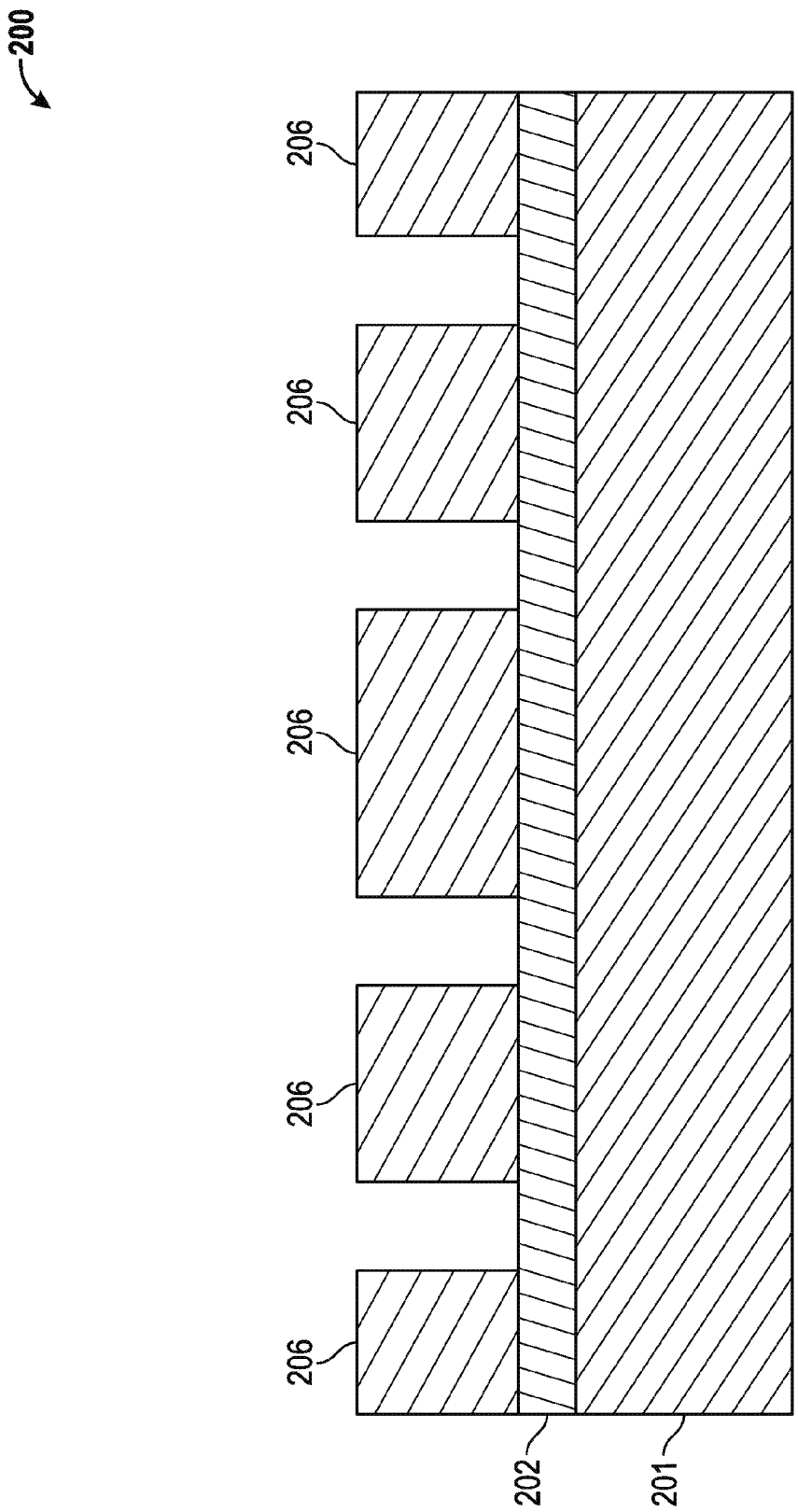

Referring now to FIG. 13, the sidewall spacers 205 are removed using a suitable etching technique, forming another plurality of void spaces. In embodiments as described herein where the sidewall spacers 205 were formed of a silicon nitride material, a suitable etching technique includes the application of hot phosphoric acid. The etch stop oxide layer 202 functions as an etch-stop for this etching step, as hot phosphoric acid selectively etches silicon nitride over silicon oxide. After etching, the ILD layer 206 remains as a discontinuous layer with spaces disposed there between, with the oxide etch stop layer 202 exposed in the spaces.

Figure 14:
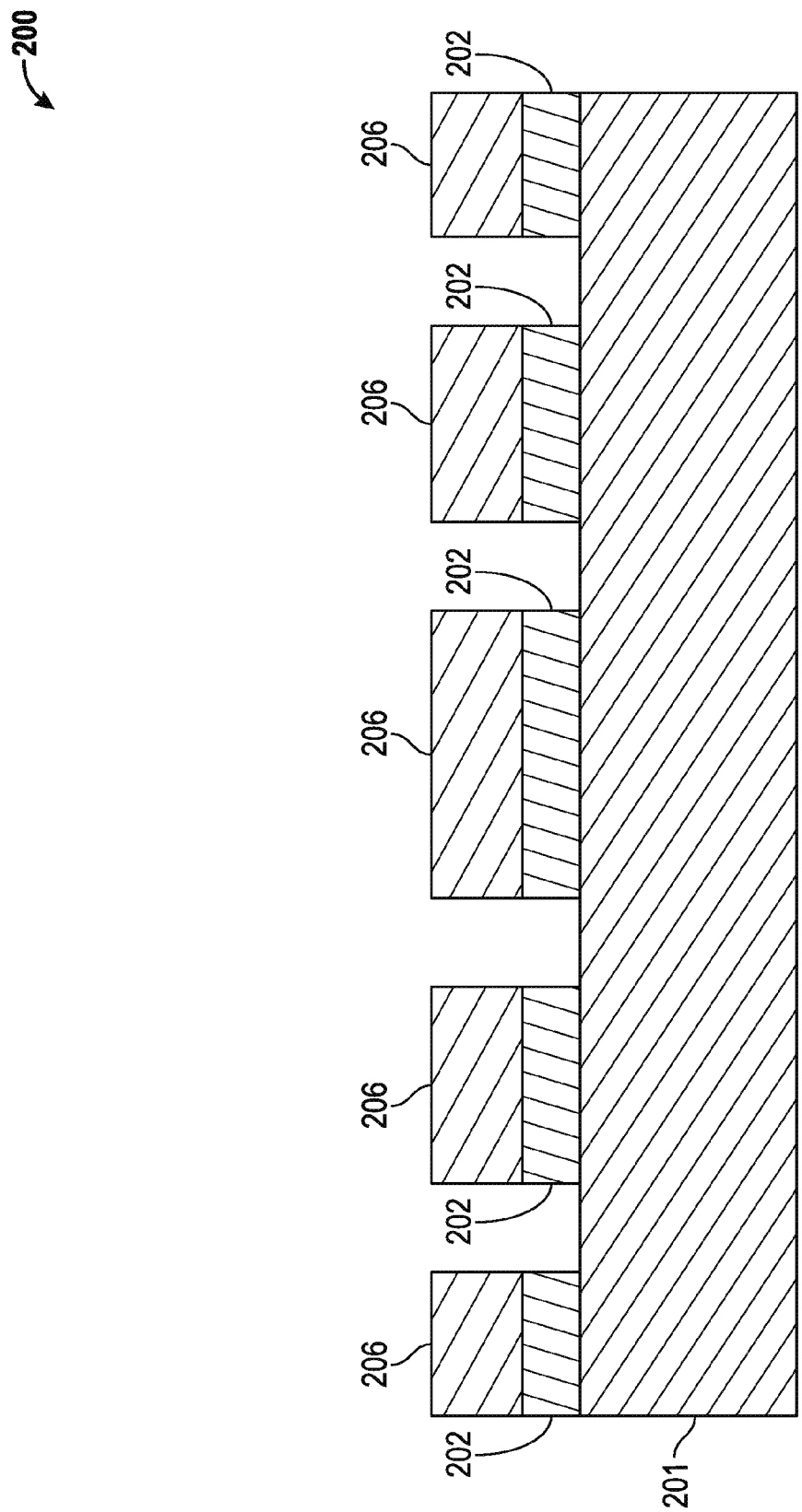

Next, with reference to FIG. 14, the fabrication process continues with the removal of a portion of the silicon oxide etch stop layer 202 and a portion of the ILD layer 206, thereby extending the previously formed void spaces, while leaving a second portion of the oxide etch stop layer 202 beneath ILD layer 206 intact. Removal of the oxide etch stop layer 202 in this manner reveals an accessible (exposed) surface of the semiconductor silicon material 201. In practice, the oxide material from layer 202 is removed by etching the desired sections of the oxide layer 202, using the remaining portions of ILD layer 206 as a hard mask, and without etching the underlying semiconductor material in layer 201. However, as both layers 202 and 206 are made of silicon oxide, the ILD layer 206 will be etched at approximately the same rate as etch stop oxide layer 202. The remaining portions of hard mask layer 206 serve as an etch mask that overlies and protects some sections of oxide etch stop material layer 202 overlying the semiconductor material layer 201. To be confident to clear the etch stop layer 202 above the semiconductor substrate 201 in the openings, some degree of overetch will be required such that the loss in thickness of the ILD layer 206 is expected to be somewhat larger than the thickness of oxide etch stop layer 202. In order to minimize the loss of the ILD layer 206, the etch stop oxide layer will thus need to be thin, as previously discussed. The etching technique and etch chemistry used to remove the oxide material layer 202 do not damage or otherwise create surface defects in the underlying semiconductor material 201. For this exemplary embodiment, an anisotropic dry etchant (such as a reactive ion etchant) is used to remove the oxide material layer 202 (and consequently an approximately equal thickness of ILD layer 206).

Figure 15:
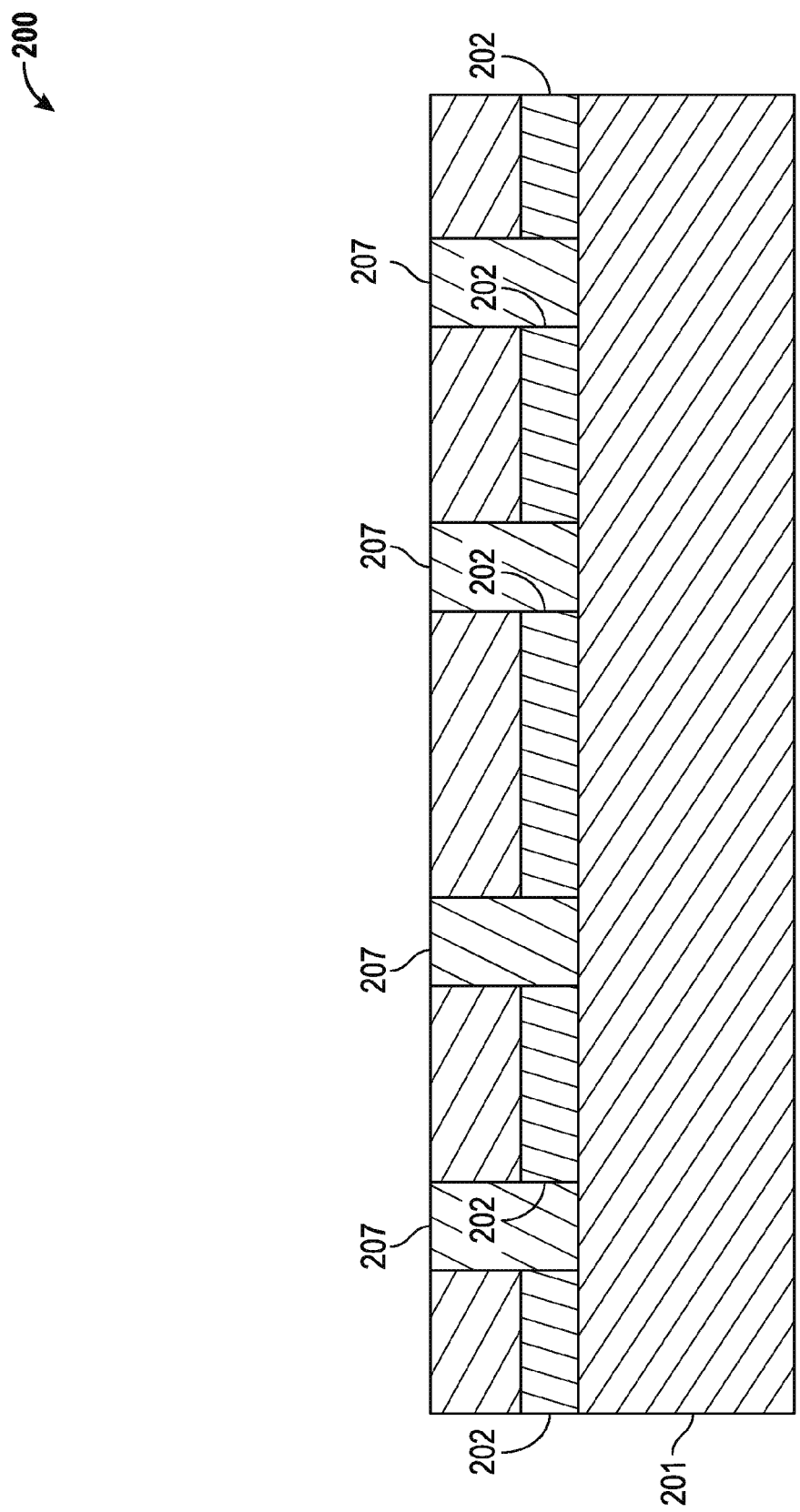

Referring now to FIG. 15, the removed portions of silicon oxide etch stop layer 202 and ILD layer 206 are filled by a process of selective epitaxial growth of a monocrystalline material to form fins 207. These fins 207 are used to form the respective gate channels in the FinFET CMOS device structure 200, as is well-known in the art. For a PMOS transistor, the selective epitaxial material is preferably silicon germanium (SiGe), Ge or a stack thereof. NMOS transistors can be fabricated in a similar manner. For an NMOS transistor, the removed portions of oxide layer 202 and ILD layer 206 are filled by selective epitaxial growth of a monocrystalline material such as silicon carbon (Si:C) having a smaller lattice constant than the lattice constant of silicon or Ge or III-V compounds having high electron mobilities. For either a PMOS transistor or an NMOS transistor, impurity doping elements can be added to the epitaxial growth reactants to appropriately dope the source and drain regions to be formed in subsequent fabrication steps. Further, those of skill in the art will understand that additional ion implantations can be used to form source-drain extensions, halo implants, set threshold values, and the like.

As with the embodiment described above with regard to FIG. 9, the structure illustrated in FIG. 15 provides a plurality of semiconductor fin structures 207 that are eclectically isolated from one another by the remaining portions of silicon oxide layer 202 and the ILD layer 206 disposed in between the fin structures 207. As such, the exemplary embodiment heretofore described provides a method for fabricating an electrically isolated CMOS FinFET device that does not include any shallow trench isolation (STI) structures, and thereby avoids the fabrication problems associated with the etching and deposition of STI structures described above in the background of this disclosure.

With regard to any of the embodiments described above, it will be appreciated that further processing steps can be performed to fabricate the CMOS device structure, as are well-known in the art. For example, further steps (not shown) conventionally include, for example, the formation of contacts and the formation of one or more patterned conductive layer across the device with dielectric layers therein between, among many others. The subject matter disclosed herein is not intended to exclude any subsequent processing steps to form and test the completed device as are known in the art.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating an electrically-isolated FinFET semiconductor device, the method comprising the steps of:
    forming a silicon oxide layer over a semiconductor substrate comprising a silicon material;
    forming a first hard mask layer over the silicon oxide layer;
    forming a plurality of sacrificial mandrels over the first hard mask layer;
    forming a plurality of sidewall spacers along the sides of the plurality of sacrificial mandrels;
    removing each of the plurality of sacrificial mandrels and portions of the first hard mask layer below the sacrificial mandrels, thereby forming a first plurality of void spaces between the sidewall spacers and remaining portions of the first hard mask layer;
    forming a second hard mask layer in the first plurality of void spaces;
    removing the sidewall spacers and the remaining portions of the first hard mask layer, thereby forming a second plurality of void spaces in the second hard mask layer;
    extending the second plurality of void spaces into the silicon oxide layer; and
    forming a plurality of fin structures in the extended second plurality of void spaces,
    wherein each fin structure of the plurality of fin structures is electrically isolated by remaining portions of the silicon oxide layer.

2. The method of claim 1, wherein the step of forming the silicon oxide layer comprises forming a thermal oxide layer by exposing the semiconductor substrate comprising the silicon material to an elevated temperature in the presence of an oxide-forming material.

3. The method of claim 1, wherein the step of forming the first hard mask layer comprises depositing a silicon nitride layer.

4. The method of claim 1, wherein the step of forming the plurality of sacrificial mandrels comprises depositing and etching an amorphous silicon material.

5. The method of claim 1, wherein the step of forming the plurality of sidewall spacers comprises depositing and etching a silicon oxide material.

6. The method of claim 1, wherein the step of removing each of the plurality of sacrificial mandrels and portions of the first hard mask layer comprises etching the sacrificial mandrels with a first etchant selective to amorphous silicon and etching the portions of the first hard mask layer with a second etchant selective to silicon nitride.

7. The method of claim 1, wherein the step of forming the second hard mask layer comprises depositing an amorphous carbon material.

8. The method of claim 1, wherein the step of removing the sidewall spacers and the remaining portions of the first hard mask layer comprises etching the sidewall spacers with a first etchant selective to silicon oxide and etching the remaining portions of the first hard mask layer with an etchant selective to silicon nitride.

9. The method of claim 1, wherein the step of extending the second plurality of void spaces comprises etching the silicon oxide layer with an etchant selective to silicon oxide.

10. The method of claim 1, wherein the step of forming the plurality of fin structures comprises epitaxially growing a material comprising Si, Si:C, SiGe, Ge, or a group III-V compound.

11. The method of claim 10, wherein the step of forming the plurality of fin structures comprises forming a portion of an nMOS device by epitaxially growing a material comprising Si, Si:C, SiGe, Ge, or a group III-V compound.

12. The method of claim 10, wherein the step of forming the plurality of fin structures comprises forming a portion of a pMOS device by epitaxially growing a material comprising Si, SiGe, or Ge.

13. The method of claim 12, wherein the step of forming the plurality of fin structures comprises forming a compressively strained SiGe or Ge material that is strained in the direction of current flow as a result of growth on an underlying silicon substrate.

14. A method of fabricating an electrically-isolated FinFET semiconductor device, the method comprising the steps of:
    forming a silicon oxide layer over a semiconductor substrate comprising a silicon material;
    forming a plurality of sacrificial mandrels over the first hard mask layer;
    forming a plurality of sidewall spacers along the sides of the plurality of sacrificial mandrels;
    removing each of the plurality of sacrificial mandrels, thereby forming a first plurality of void spaces between the sidewall spacers;
    forming an interlayer dielectric layer in the first plurality of void spaces;
    removing the sidewall spacers, thereby forming a second plurality of void spaces in the interlayer dielectric layer;
    extending the second plurality of void spaces into the silicon oxide layer; and
    forming a plurality of fin structures in the extended second plurality of void spaces,
    wherein each fin structure of the plurality of fin structures is electrically isolated by remaining portions of the interlayer dielectric layer and the silicon oxide layer.

15. The method of claim 14, wherein the step of forming the plurality of sacrificial mandrels comprises depositing and etching an amorphous silicon material.

16. The method of claim 14, wherein the step of forming the plurality of sidewall spacers comprises depositing and etching a silicon nitride material.

17. The method of claim 14, wherein the step of forming the interlayer dielectric layer comprises depositing a silicon oxide material.

18. The method of claim 14, wherein the step of forming the plurality of fin structures comprises epitaxially growing a material comprising Si, Si:C, SiGe, Ge, or a group III-V compound.

19. The method of claim 18, wherein the step of forming the plurality of fin structures comprises forming a compressively strained SiGe or Ge material that is strained in the direction of current flow as a result of growth on an underlying silicon substrate.

20. A method of fabricating an electrically-isolated Fin-FET semiconductor device, the method comprising the steps of:

forming a thermal oxide layer over a semiconductor substrate comprising a silicon material to a thickness of about 20 nm to about 200 nm by exposing the semiconductor substrate comprising the silicon material to an elevated temperature in the presence of an oxide-forming material;

depositing a silicon nitride layer over the thermal oxide layer;

depositing and etching an amorphous silicon material to form a plurality of sacrificial mandrels over the silicon nitride layer;

depositing and etching a silicon oxide material to form a plurality of sidewall spacers along the sides of the plurality of sacrificial mandrels;

removing each of the plurality of sacrificial mandrels by applying an etchant selective to amorphous silicon and removing portions of the silicon nitride layer below the sacrificial mandrels by applying an etchant selective to silicon nitride, thereby forming a first plurality of void spaces between the sidewall spacers and remaining portions of the silicon nitride layer;

depositing an amorphous carbon material in the first plurality of void spaces;

removing the sidewall spacers by applying an etchant selecting to silicon oxide and removing the remaining portions of the silicon nitride layer by applying an etchant selective to silicon nitride, thereby forming a second plurality of void spaces in the amorphous carbon material;

extending the second plurality of void spaces into the silicon oxide layer by applying an etchant selective to silicon oxide; and epitaxially growing a material comprising Si, Si:C, SiGe, Ge, and/or group III-V compounds in the extended second plurality of void spaces to form a plurality of fin structures, wherein each fin structure of the plurality of fin structures is electrically isolated by remaining portions of the silicon oxide layer.

* * * * *